United States Patent
Reddy Naru et al.

(10) Patent No.: US 10,320,405 B2
(45) Date of Patent: *Jun. 11, 2019

(54) PATTERN BASED ESTIMATION OF ERRORS IN ADC

(71) Applicant: Texas Instruments Incorporated, Dallas, TX (US)

(72) Inventors: Srinivas Kumar Reddy Naru, Markapur (IN); Visvesvaraya Pentakota Appala, Bangalore (IN); Shagun Dusad, Bangalore (IN); Neeraj Shrivastava, Bangalore (IN); Viswanathan Nagarajan, Bangalore (IN); Ani Xavier, Bangalore (IN); Rishi Soundararajan, Bangalore (IN); Sai Aditya Nurani, Bangalore (IN); Roswald Francis, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/909,378

(22) Filed: Mar. 1, 2018

(65) Prior Publication Data

US 2018/0191362 A1    Jul. 5, 2018

Related U.S. Application Data

(63) Continuation of application No. 15/485,552, filed on Apr. 12, 2017, now Pat. No. 9,941,893.

(30) Foreign Application Priority Data

Apr. 19, 2016   (IN) .............. 201641013525

(51) Int. Cl.
*H03M 1/00* (2006.01)
*H03M 1/06* (2006.01)
(Continued)

(52) U.S. Cl.
CPC ............. *H03M 1/06* (2013.01); *H03M 1/109* (2013.01); *H03M 1/1038* (2013.01);
(Continued)

(58) Field of Classification Search
CPC ........ H03M 1/06; H03M 1/1205; H03M 1/12; H03M 1/1023; H03M 1/203; H03M 1/207;
(Continued)

(56) References Cited

U.S. PATENT DOCUMENTS 6,570,517 B1   5/2003   Geraghty et al.
7,107,175 B2   9/2006   Maloberti et al.
(Continued)

*Primary Examiner* — Jean B Jeanglaude
(74) *Attorney, Agent, or Firm* — John R. Pessetto; Charles A. Brill; Frank D. Cimino

(57) ABSTRACT

In described examples, an analog to digital converter (ADC) includes a flash ADC. The flash ADC generates a flash output in response to an input signal, and an error correction block generates a known pattern. A selector block is coupled to the flash ADC and the error correction block, and generates a plurality of selected signals in response to the flash output and the known pattern. A digital to analog converter (DAC) is coupled to the selector block, and generates a coarse analog signal in response to the plurality of selected signals. A residue amplifier is coupled to the DAC, and generates a residual analog signal in response to the coarse analog signal, the input signal and an analog PRBS (pseudo random binary sequence) signal. A residual ADC generates a residual code in response to the residual analog signal.

26 Claims, 3 Drawing Sheets

(51) Int. Cl.
  *H03M 1/12* (2006.01)
  *H03M 1/10* (2006.01)
  H03M 1/16 (2006.01)
  H03M 1/36 (2006.01)

(52) U.S. Cl.
  CPC .......... *H03M 1/1205* (2013.01); *H03M 1/164* (2013.01); *H03M 1/361* (2013.01)

(58) Field of Classification Search
  CPC .... H03M 1/0621; H03M 1/089; H03M 1/185; G03G 3/3068
  USPC .......................................... 341/110, 155, 156
  See application file for complete search history.

(56) References Cited

U.S. PATENT DOCUMENTS

| | | |
|---|---|---|
| 7,355,536 B2 | 4/2008 | Dempsey et al. |
| 7,579,896 B2 * | 8/2009 | Faust ...................... G06F 1/025 327/185 |
| 8,760,335 B1 | 6/2014 | Kappes |
| RE45,227 E | 11/2014 | Kidambi |
| 8,890,728 B2 | 11/2014 | Le Dortz et al. |

\* cited by examiner

PATTERN BASED ESTIMATION OF ERRORS IN ADC

CROSS REFERENCES TO RELATED APPLICATIONS

This continuation application claims priority from U.S. patent application Ser. No. 15/485,552, filed on Apr. 12, 2017, which claims priority from India provisional patent application No. 201641013525 filed on Apr. 19, 2016, both of which are hereby incorporated by reference in their entirety.

TECHNICAL FIELD

The present disclosure is generally related to analog to digital converters (ADCs), and more particularly to pattern based estimation of errors in the ADC.

BACKGROUND

Wireless base stations are changing from conventional radio frequency (RF) signal chains to RF sampling ADC, thus avoiding use of multiple components such as mixers and filters. RF sampling ADC enables majority of signal processing in digital domain instead of utilizing expensive analog signal chains. RF sampling ADC also enables complete spectral sampling and multi-band support.

An RF sampling ADC that supports a sampling rate of the order of giga-sample-per-second (GSPS) requires multiple pipelined ADCs. To minimize the power consumption of RF sampling ADC, residue amplifiers are shared between a set of interleaved channels of pipelined ADCs. A residue amplifier is an open loop amplifier, and a hold time of the residue amplifier for each interleaved channel is of the order of 300 ps with no reset phase. This results in significant settling and memory errors.

Due to open loop amplifier structure of the residue amplifier, an amplifier gain is different from an ideal value. The error in amplifier gain, settling errors and memory errors vary across devices and across temperature. These errors result in degradation of RF sampling ADC performance.

SUMMARY

According to an aspect of the disclosure, an analog to digital converter (ADC) is disclosed. The ADC includes a flash ADC. The flash ADC generates a flash output in response to an input signal, and an error correction block generates a known pattern. A selector block is coupled to the flash ADC and the error correction block, and generates a plurality of selected signals in response to the flash output and the known pattern. A digital to analog converter (DAC) is coupled to the selector block, and generates a coarse analog signal in response to the plurality of selected signals. A residue amplifier is coupled to the DAC, and generates a residual analog signal in response to the coarse analog signal, the input signal and an analog PRBS (pseudo random binary sequence) signal. A residual ADC generates a residual code in response to the residual analog signal.

BRIEF DESCRIPTION OF THE VIEWS OF DRAWINGS

DETAILED DESCRIPTION OF THE EMBODIMENTS

Figure 1:
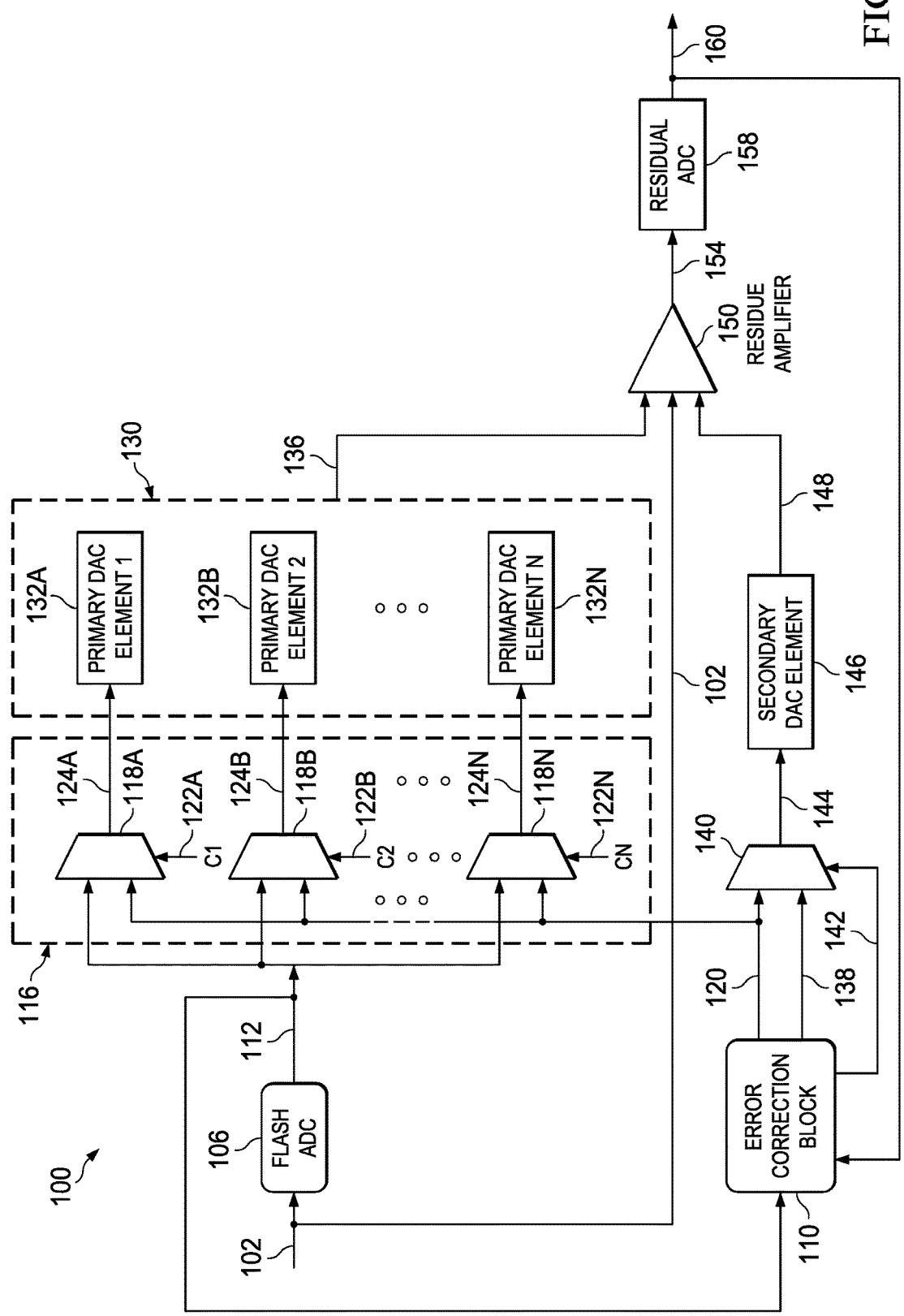
FIG. 1 illustrates an analog to digital converter (ADC), according to an embodiment.

FIG. 1 illustrates an analog to digital converter (ADC) 100, according to an embodiment. In one example, the ADC is a pipeline ADC. The ADC 100 includes a flash ADC 106, an error correction block 110, a selector block 116, a digital to analog converter (DAC) 130, a residue amplifier 150, and a residual ADC 158. The ADC 100 also includes a secondary multiplexer 140 and a secondary DAC element 146. The flash ADC 106 receives an input signal 102. The selector block 116 is coupled to the flash ADC 106 and the error correction block 110. The DAC 130 is coupled to the selector block 116.

The residue amplifier 150 is coupled to the DAC 130 and the secondary DAC element 146. The residual ADC 158 is coupled to the residue amplifier 150. The error correction block 110 is coupled to the residual ADC 158 and the flash ADC 106. The secondary multiplexer 140 is coupled to the error correction block 110, and the secondary DAC element 146 is coupled between the secondary multiplexer 140 and the residue amplifier 150. The selector block 116 includes a plurality of primary multiplexers illustrated as 118A, 118B to 118N. The selector block 116 receives a plurality of control signals illustrated as C1 122A, C2 122B to CN 122N.

Each primary multiplexer receives a control signal from the error correction block 110. For example, the primary multiplexer 118A receives the control signal C1 122A, and the primary multiplexer 118N receives the control signal CN 122N. The DAC 130 includes a plurality of primary DAC elements illustrated as primary DAC element 1 132A, primary DAC element 2 132B to primary DAC element N 13N2N. The ADC 100 may include one or more additional components known to those skilled in the relevant art and are not discussed here for simplicity of the description.

The operation of the ADC 100 illustrated in FIG. 1 is explained now. The flash ADC 106 generates a flash output 112 in response to the input signal 102. The error correction block 110 generates a known pattern 120. The selector block 116 generates a plurality of selected signals 124A, 124B to 124N in response to the flash output 112 and the known pattern 120. Each primary multiplexer of the plurality of primary multiplexers 118A to 118N generates a selected signal in response to the known pattern 120, the flash output 112 and a control signal. For example, the primary multiplexer 118A generates the selected signal 124A in response to the flash output 112, the known pattern 120 and the control signal C1 122A.

The known pattern 120 is a predefined set of bits. In one example, the known pattern 120 is defined as per the specification of a device using the ADC 100. In another example, the known pattern 120 is pre-programmed by a chip manufacturer. The DAC 130 generates a coarse analog signal 136 in response to the plurality of selected signals 124A to 124N received from the selector block 116. Each primary DAC element in the DAC 130 receives a selected signal. For example, the primary DAC element 1 132A receives the selected signal 124A, and the primary DAC element N 132N receives the selected signal 124N.

The secondary multiplexer 140 generates a digital PRBS (pseudo random binary sequence) signal 144 in response to the known pattern 120, a coarse PRBS signal 138 and a secondary control signal 142. The secondary multiplexer 140 receives the coarse PRBS signal 138 and the secondary control signal 142 from the error correction block 110. The secondary DAC element 146 generates an analog PRBS signal 148 in response to the digital PRBS signal 144. The residue amplifier 150 generates a residual analog signal 154 in response to the coarse analog signal 136, the input signal 102 and the analog PRBS signal 148.

The residual ADC 158 generates a residual code 160 in response to the residual analog signal 154 received from the residue amplifier 150. The residual code 160 is averaged over T cycles to measure an averaged code generated by the ADC 100. T is an integer. The error correction block 110 receives the flash output 112 and the residual code 160.

The ADC 100 operates in a startup mode and a steady-state mode. In the startup mode, the error correction block 110 measures a coarse gain error, a fine gain error, a PRBS error, a memory error and a DAC mismatch error. The coarse gain error and the fine gain error are associated with the residue amplifier 150. The PRBS error is associated with the secondary DAC element 146. The memory error is associated with the residue amplifier 150, and the DAC mismatch error is associated with each primary DAC element in the DAC 130.

The error correction block 110 generates a corrected PRBS design value based on the coarse gain error, the fine gain error, the PRBS error, the memory error and the DAC mismatch error. The error correction block 110 use the corrected PRBS design value in the steady-state to measure the input signal 102.

The measurement of coarse gain error by the error correction block 110 is discussed now. The error correction block 110 provides the known pattern 120 to a primary DAC element in the DAC 130, and the flash ADC 106 provides a predefined set of bits to the remaining primary DAC elements in the DAC 130. For example, the error correction block 110 provides the control signal C1 122A to the primary multiplexer 118A such that it generates the known pattern 120 which is received by the primary DAC element 1 132A. The error correction block 110 also provides the control signals to the remaining primary multiplexers such that they generate the predefined set of bits provided by the flash ADC 106. These predefined set of bits are received by the remaining primary DAC elements 132B to 132N.

The predefined set of bits is a set of zeroes and/or a set of ones. In one example, the flash ADC 106 provides equivalent set of zeroes and ones to the remaining primary DAC elements 132B to 132N. The error correction block 110 measures the hence generated averaged code by the ADC 100. The averaged code generated by the ADC 100 is the residual code 160 averaged over T cycles.

The error correction block 110 measures the coarse gain error from the averaged code generated by the ADC 100, a step size of the DAC 130 and a reference averaged code. In one example, the reference averaged code is a design parameter known to the designer. In another example, reference averaged code is predefined by a user. In one example the coarse gain error is defined by the following equation:

$$G_{coarse\_err} = \frac{C_{actual} - C_{ref}}{S} \quad (1)$$

where, $G_{coarse\_err}$ is the coarse gain error, $C_{actual}$ is the averaged code generated by the ADC 100, $C_{ref}$ is the reference averaged code and S is the step size of the DAC 130. In another example, the reference averaged code is a function of the step size of the DAC 130 and a gain of the residue amplifier 150.

The measurement of fine gain error by the error correction block 110 is discussed now. The error correction block 110 provides the known pattern 120 to each primary DAC element over M loops. M is an integer and M is equal to a number of primary DAC elements. In each loop, the error correction block 110 provides the known pattern 120 to a primary DAC element, and the flash ADC 106 provides the predefined set of bits to the remaining primary DAC elements. The error correction block 110 thereafter measures the averaged code generated by the ADC 100 in each loop.

For example, in a first loop of M loops, the error correction block 110 provides the known pattern 120 to the primary DAC element 1 132A, and the flash ADC 106 provides the predefined set of bits to the remaining primary DAC elements 132B to 132N. The error correction block 110 measures the averaged code generated by the ADC 100 in the first loop. In a second loop of M loops, the error correction block 110 provides the known pattern 120 to the primary DAC element 2 132B, and the flash ADC 106 provides the predefined set of bits to the remaining primary DAC elements 132A and 132C to 132N. The error correction block 110 measures the averaged code generated by the ADC 100 in the second loop.

The error correction block 110 measures the fine gain error from the averaged code generated by the ADC 100 in each loop of the M loops, the step size of the DAC 130 and the reference averaged code. In one example, the fine gain error is defined by the following equation:

$$G_{fine\_err} = \frac{\frac{1}{M}\Sigma C_{actual\_M} - C_{ref}}{S} \quad (2)$$

where, $G_{fine\_err}$ is the fine gain error, $C_{actual}$ is the averaged code generated by the ADC 100 in the Mth loop, $C_{ref}$ is the reference averaged code and S is the step size of the DAC 130.

The measurement of DAC mismatch error is discussed now. The error correction block 110 measures a mismatch associated with a primary DAC element of the plurality of primary DAC elements in the DAC 130. The error correction block 110 measures a mismatch of a first primary DAC element from the coarse gain error, the fine gain error, the step size of the DAC 130 and the averaged code generated by the ADC 100 in a first loop of M loops. The known pattern 120 is provided to the first DAC element in the first loop.

For example, in a first loop of M loops, the error correction block 110 provides the known pattern 120 to the primary DAC element 1 132A, and the flash ADC 106 provides the predefined set of bits to the remaining primary DAC elements 132B to 132N. The error correction block 110 measures the averaged code generated by the ADC 100 in the first loop. The error correction block 110 measures the mismatch of the primary DAC element 1 132A from the coarse gain error, the fine gain error, the step size of the DAC 130 and the averaged code generated by the ADC 100 in the first loop of M loops. In one example, the coarse gain error is measured as per equation 1, and the fine gain error is measured as per equation 2. In one example, the DAC mismatch error is defined by the following equation:

$$S_{mismatch} = \frac{C_{actual\_M}}{G + G_{coarse\_err} + G_{fine\_err}} - S \quad (3)$$

where, $S_{mismatch}$ is the mismatch associated with the DAC element, $G_{fine\_err}$ is the fine gain error, $G_{coarse\_err}$ is the coarse gain error, $C_{actual\_M}$ is the averaged code generated by the ADC 100 in the Mth loop, G is the gain of the residue amplifier 150 and S is the step size of the DAC 130.

The measurement of PRBS error is explained now. The error correction block 110 provides the known pattern 120 to the secondary multiplexer 140 and the secondary control signal 142 to the secondary multiplexer 140. The digital PRBS signal 144 generated by the secondary multiplexer 140 is equal to the known pattern 120. The error correction block 110 measures the averaged code generated by the ADC 100.

The error correction block 110 measures the PRBS error from the averaged code generated by the ADC 100, the fine gain error, the coarse gain error, the reference averaged code and a magnitude of the coarse PRBS signal 138. In one version, the coarse gain error is measured as per equation 1, and the fine gain error is measured as per equation 2. In one example, the PRBS error is defined by the following equation:

$$D_{error} = \frac{C_{actual}}{G + G_{coarse\_err} + G_{fine\_err}} - D \quad (4)$$

where, $D_{error}$ is the PRBS error, $G_{fine\_err}$ is the fine gain error, $G_{coarse\_err}$ is the coarse gain error, G is the gain of the residue amplifier 150, $C_{actual}$ is the averaged code generated by the ADC 100, D is the magnitude of the coarse PRBS signal 138.

The measurement of memory error is explained now. The error correction block 110 provides the known pattern 120 to a primary DAC element in the DAC 130, and the flash ADC 106 provides the predefined set of bits to the remaining primary DAC elements in the DAC 130. For example, the error correction block 110 provides the control signal C1 122A to the primary multiplexer 118A such that it generates the known pattern 120 which is received by the primary DAC element 1 132A. The error correction block 110 also provides the control signals to the remaining primary multiplexers such that they generate the predefined set of bits provided by the flash ADC 106. These predefined set of bits are received by the remaining primary DAC elements 132B to 132N.

The predefined set of bits is a set of zeroes and/or a set of ones. In one example, the flash ADC 106 provides equivalent set of zeroes and ones to the remaining primary DAC elements 132B to 132N. The error correction block 110 measures a sub-averaged code generated by the ADC 100. The sub-averaged code is average of residual code generated when consecutive bits in the known pattern 120 undergo a state transition over T cycles.

The error correction block 110 measures the memory error from the sub-averaged code generated by the ADC 100, the step size of the DAC 130, the coarse gain error, the fine gain error and the reference averaged code. In one example, the reference averaged code is a design parameter known to the designer. In another example, the reference averaged code is predefined by a user. In one example the memory error is defined by the following equation:

$$M_{error} = \frac{C_{mem\_actual}}{S(G + G_{coarse\_err} + G_{fine\_err})} \quad (5)$$

where, $M_{error}$ is the memory error, $G_{coarse\_err}$ is the coarse gain error, $C_{mem\_actual}$ is the sub-averaged code generated by the ADC 100, $G_{fine\_err}$ is the fine gain error, G is the gain of the residue amplifier 150 and S is the step size of the DAC 130. In another example, the reference averaged code is a function of the step size of the DAC 130 and a gain of the residue amplifier 150.

The error correction block 110 measures the coarse gain error, the fine gain error, the PRBS error, the memory error and the DAC mismatch error as described above in the startup mode. The error correction block 110 generates the corrected PRBS design value based on the coarse gain error, the fine gain error, the PRBS error, the memory error and the DAC mismatch error. The error correction block 110 use the corrected PRBS design value in the steady-state to measure the input signal 102.

The ADC 100 provides a unique approach of measuring all the associated errors in the startup mode, and using the results of the startup mode to determine the input signal 102 in the steady-state mode. Trimming of PRBS error, coarse gain error and DAC mismatch error is not required in the ADC 100 as all these errors are measured in the startup mode. Hence, a test time of the ADC 100 is significantly reduced. This also results in saving of larger number of fuses.

The time taken by the ADC 100 in startup mode is very less as the known pattern 120 is used to determine all the associated errors. Hence, a power up time of the ADC 100 is significantly reduced.

Figure 2:
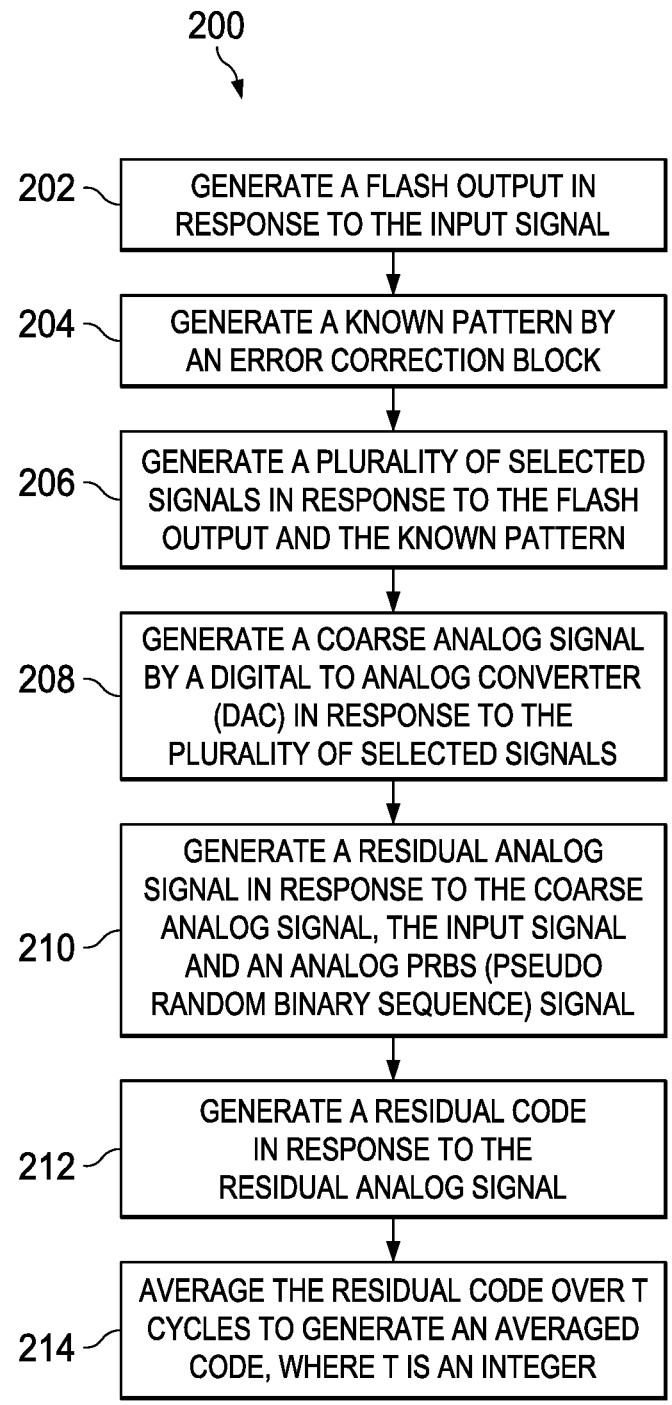
FIG. 2 is a flowchart to illustrate a method of converting an input signal in an analog to digital converter (ADC), according to an embodiment.

FIG. 2 is a flowchart 200 to illustrate a method of converting an input signal in an analog to digital converter (ADC), according to an embodiment. The flowchart 200 is explained in connection with the ADC 100. At step 202, a flash output is generated in response to the input signal. In ADC 100, the flash ADC 106 generates a flash output 112 in response to the input signal 102. At step 204, a known pattern is generated by an error correction block. The error correction block 110, in ADC 100, generates a known pattern 120. The known pattern 120 is a predefined set of bits. In one example, the known pattern 120 is defined as per the specification of a device using the ADC 100. In another example, the known pattern 120 is pre-programmed by a chip manufacturer.

At step 206, a plurality of selected signals is generated in response to the flash output and the known pattern. In ADC 100, the selector block 116 generates a plurality of selected signals 124A, 124B to 124N in response to the flash output 112 and the known pattern 120. Each primary multiplexer of the plurality of primary multiplexers 118A to 118N generates a selected signal in response to the known pattern 120, the flash output 112 and a control signal. For example, the primary multiplexer 118A generates the selected signal 124A in response to the flash output 112, the known pattern 120 and the control signal C1 122A.

At step 208, a coarse analog signal is generated by a digital to analog converter (DAC) in response to the plurality of selected signals. The DAC 130, in ADC 100, generates a coarse analog signal 136 in response to the plurality of selected signals 124A to 124N received from the selector block 116. The DAC 130 includes a plurality of primary DAC elements illustrated as primary DAC element 1 132A, primary DAC element 2 132B to primary DAC element N 132N. Each primary DAC element in the DAC 130 receives a selected signal. For example, the primary DAC element 1 132A receives the selected signal 124A, and the primary DAC element N 132N receives the selected signal 124N.

A residual analog signal is generated in response to the coarse analog signal, the input signal and an analog PRBS (pseudo random binary sequence) signal, at step 210. In ADC 100, the secondary multiplexer 140 multiplexes the known pattern 120 and a coarse PRBS signal 138 to generate a digital PRBS (pseudo random binary sequence) signal 144. The secondary multiplexer 140 receives a secondary control signal 142 as a selection signal from the error correction block 110. The secondary multiplexer 140 receives the coarse PRBS signal 138 and the known pattern 120 from the error correction block 110. The secondary DAC element 146 generates an analog PRBS signal 148 in response to the digital PRBS signal 144. The residue amplifier 150 generates a residual analog signal 154 in response to the coarse analog signal 136, the input signal 102 and the analog PRBS signal 148.

At step 212, a residual code is generated in response to the residual analog signal. The residual code is averaged over T cycles to generate an averaged code, at step 214. T is an integer. In ADC 100, the residual ADC 158 generates a residual code 160 in response to the residual analog signal 154 received from the residue amplifier 150. The residual code 160 is averaged over T cycles to measure an averaged code generated by the ADC 100. T is an integer. The error correction block 110 receives the flash output 112 and the residual code 160.

The ADC operates in a startup mode and a steady-state mode. In the startup mode, a coarse gain error, a fine gain error, a PRBS error, a memory error and a DAC mismatch error are measured. A corrected PRBS design value is generated based on the coarse gain error, the fine gain error, the PRBS error, the memory error and the DAC mismatch error. The corrected PRBS design value is used in the steady-state to measure the input signal.

The known pattern 120 is provided to a primary DAC element in the DAC, and a predefined set of bits is provided to the remaining primary DAC elements in the DAC. The predefined set of bits is a set of zeroes and/or a set of ones. In ADC 100, the flash ADC 106 provides equivalent set of zeroes and ones to the remaining primary DAC elements 132B to 132N. The error correction block 110 measures the hence generated averaged code by the ADC 100. The averaged code generated by the ADC 100 is the residual code 160 averaged over T cycles.

The coarse gain error is measured from the averaged code generated by the ADC, a step size of the DAC and a reference averaged code. In one example, the reference averaged code is a design parameter known to the designer. In another example, the reference averaged code is predefined by a user.

The measurement of fine gain error is discussed now. The known pattern is provided to each primary DAC element over M loops. M is an integer and M is equal to a number of primary DAC elements. In each loop, the known pattern is provided to a primary DAC element, and the predefined set of bits are provided to the remaining primary DAC elements. Thereafter, the averaged code generated by the ADC in each loop is measured. The fine gain error is measured from the averaged code generated by the ADC in each loop of the M loops, the step size of the DAC and the reference averaged code.

The measurement of DAC mismatch error is discussed now. A mismatch of a first primary DAC element is measured from the coarse gain error, the fine gain error, the step size of the DAC and the averaged code generated by the ADC in a first loop of M loops. The known pattern is provided to the first DAC element in the first loop.

The measurement of PRBS error is explained now. The known pattern is provided as the digital PRBS signal. The analog PRBS signal is generated from the digital PRBS signal. The averaged code generated by the ADC is measured. The PRBS error is measured from the averaged code generated by the ADC, the fine gain error, the coarse gain error, the reference averaged code and a magnitude of the coarse PRBS signal.

The measurement of memory error is explained now. The known pattern is provided to a primary DAC element in the DAC, and the predefined set of bits is provided to the remaining primary DAC elements in the DAC. A sub-averaged code generated by the ADC is measured. The sub-averaged code is average of residual code generated when consecutive bits in the known pattern undergo a state transition over T cycles. The memory error is measured from the sub-averaged code generated by the ADC, the step size of the DAC, the coarse gain error, the fine gain error and the reference averaged code. In one example, the reference averaged code is a design parameter known to the designer. In another example, the reference averaged code is predefined by a user. In yet another example, the reference averaged code is a function of the step size of the DAC and a gain of the residue amplifier.

The ADC, described through flowchart 200, provides a unique approach of measuring all the associated errors in the startup mode, and using the results of the startup mode to determine the input signal in the steady-state mode. Trimming of PRBS error, coarse gain error and DAC mismatch error is not required in the ADC as all these errors are measured in the startup mode. Hence, a test time of the ADC is significantly reduced. This also results in saving of larger number of fuses. The time taken by the ADC in startup mode is very less as the known pattern is used to determine all the associated errors. Hence, a power up time of the ADC is significantly reduced.

Figure 3:
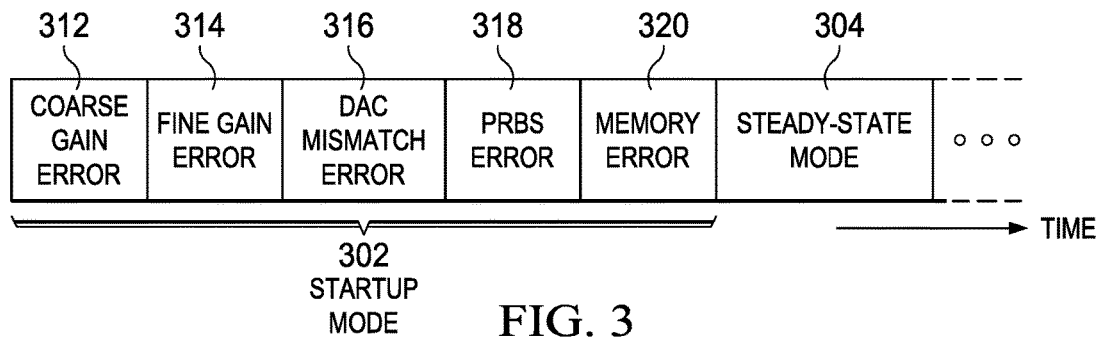
FIG. 3 illustrates a timing diagram of an ADC, according to an embodiment.

FIG. 3 illustrates a timing diagram of an ADC, according to an embodiment. The timing diagram is explained in connection with the ADC 100. The figure illustrates a startup mode 302 and a steady-state mode 304. In the startup mode 302, the ADC measures a coarse gain error 312, a fine gain error 314, a DAC mismatch error 316, a PRBS error 318 and a memory error 320 in that order. In one version, the ADC does not measure one or more of these errors. In another version, the ADC measure one or more of these errors simultaneously. In yet another version, the order followed by ADC in measurement of these errors in predefined by a designer.

The coarse gain error, the fine gain error and the memory error are associated with the residue amplifier 150 in ADC 100. The PRBS error is associated with the secondary DAC element 146. The DAC mismatch error is associated with each primary DAC element in the DAC 130. The ADC first measures coarse gain error from an averaged code generated by the ADC, a step size of the DAC and a reference averaged code. The averaged code generated by the ADC 100 is the residual code 160 averaged over T cycles. In one example, the reference averaged code is a design parameter known to the designer.

This is followed by measurement of fine gain error by the ADC. In ADC 100, the fine gain error is measured from the averaged code generated by the ADC 100 in each loop of the M loops, the step size of the DAC 130 and the reference averaged code. The ADC measure the DAC mismatch error associated with each DAC element after measurement of the fine gain error. A mismatch of a first primary DAC element is measured from the coarse gain error, the fine gain error, the step size of the DAC and the averaged code generated by the ADC in a first loop of M loops.

The ADC measures PRBS error from the averaged code generated by the ADC, the fine gain error, the coarse gain error, the reference averaged code and a magnitude of the coarse PRBS signal. The ADC measures the memory error after computing PRBS error. The memory error is measured from the sub-averaged code generated by the ADC, the step size of the DAC 130, the coarse gain error, the fine gain error and the reference averaged code. A corrected PRBS design value is generated based on the coarse gain error, the fine gain error, the PRBS error, the memory error and the DAC mismatch error. The corrected PRBS design value is used by the ADC in the steady-state mode 304 to measure the input signal.

Figure 4:
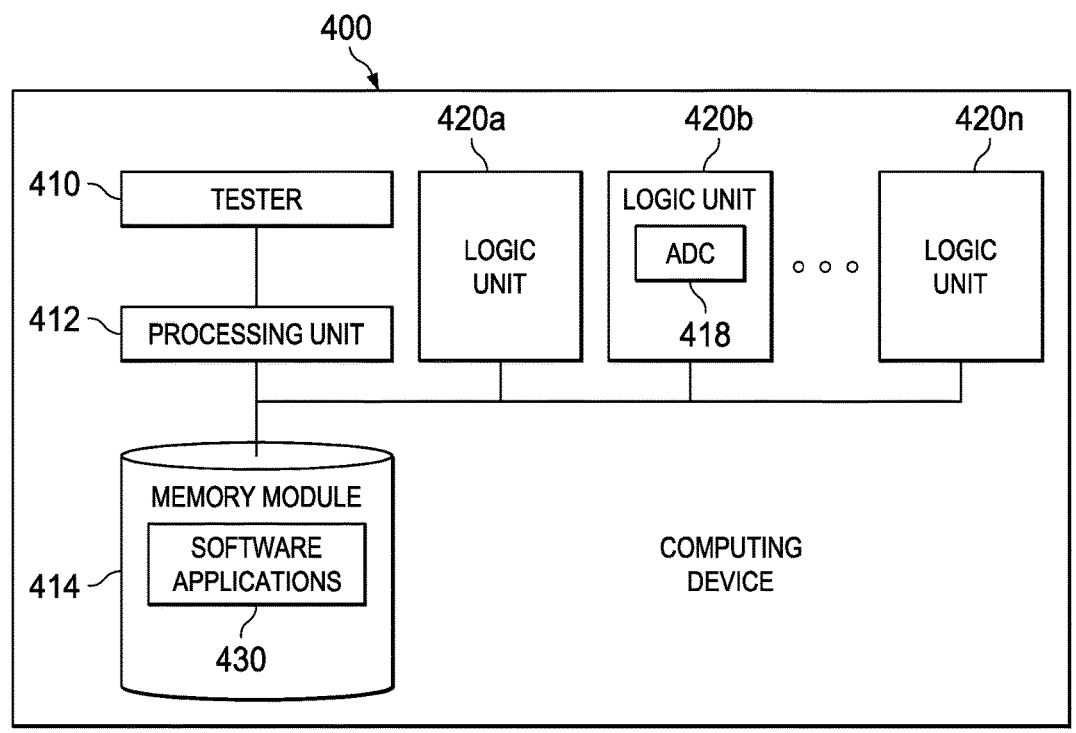
FIG. 4 illustrates a computing device, according to an embodiment.

FIG. 4 illustrates a computing device 400, according to an embodiment. The computing device 400 is, or is incorporated into, a mobile communication device, such as a mobile phone, a personal digital assistant, a transceiver, a personal computer, or any other type of electronic system. The computing device 400 may include one or more additional components known to those skilled in the relevant art and are not discussed here for simplicity of the description.

In some embodiments, the computing device 400 comprises a megacell or a system-on-chip (SoC) which includes a processing unit 412 such as a CPU (Central Processing Unit), a memory module 414 (e.g., random access memory (RAM)) and a tester 410. The processing unit 412 can be, for example, a CISC-type (Complex Instruction Set Computer) CPU, RISC-type CPU (Reduced Instruction Set Computer), or a digital signal processor (DSP).

The memory module 414 (which can be memory such as RAM, flash memory, or disk storage) stores one or more software applications 430 (e.g., embedded applications) that, when executed by the processing unit 412, performs any suitable function associated with the computing device 400. The tester 410 comprises logic that supports testing and debugging of the computing device 400 executing the software applications 430.

For example, the tester 410 can be used to emulate a defective or unavailable component(s) of the computing device 400 to allow verification of how the component(s), were it actually present on the computing device 400, would perform in various situations (e.g., how the component(s) would interact with the software applications 430). In this way, the software applications 430 can be debugged in an environment which resembles post-production operation.

The processing unit 412 typically comprises memory and logic which store information frequently accessed from the memory module 414. The computing device 400 includes a plurality of logic units illustrated as 420*a*, 420*b* to 420*n*. The plurality of logic units are coupled to the processing unit 412 and the memory module 414. A logic unit can be, for example, one of the following, but not limited to, a transmitter, a receiver, and a delta sigma modulator. At least one logic unit of the plurality of logic units includes an analog to digital converter (ADC) 418. The ADC 418 is similar in connection and operation to the ADC 100. The ADC 418 includes a flash ADC, an error correction block, a selector block, a digital to analog converter (DAC), a residue amplifier, and a residual ADC. The ADC 418 also includes a secondary multiplexer and a secondary DAC element.

The flash ADC generates a flash output in response to an input signal. The error correction block generates a known pattern. The selector block generates a plurality of selected signals in response to the flash output and the known pattern. The known pattern is a predefined set of bits. The DAC generates a coarse analog signal in response to the plurality of selected signals received from the selector block.

The secondary multiplexer generates a digital PRBS (pseudo random binary sequence) signal in response to the known pattern, a coarse PRBS signal and a secondary control signal. The secondary DAC element generates an analog PRBS signal in response to the digital PRBS signal. The residue amplifier generates a residual analog signal in response to the coarse analog signal, the input signal and the analog PRBS signal. The residual ADC generates a residual code in response to the residual analog signal received from the residue amplifier. The residual code is averaged over T cycles to measure an averaged code generated by the ADC 418. T is an integer.

The ADC 418 operates in a startup mode and a steady-state mode. In the startup mode, the error correction block measures a coarse gain error, a fine gain error, a PRBS error, a memory error and a DAC mismatch error. The error correction block generates a corrected PRBS design value based on the coarse gain error, the fine gain error, the PRBS error, the memory error and the DAC mismatch error. The error correction block use the corrected PRBS design value in the steady-state to measure the input signal.

The ADC 418 provides a unique approach of measuring all the associated errors in the startup mode, and using the results of the startup mode to determine the input signal in the steady-state mode. Trimming of PRBS error, coarse gain error and DAC mismatch error is not required in the ADC 418 as all these errors are measured in the startup mode. Hence, a test time of the ADC 418 is significantly reduced. This also results in saving of larger number of fuses. The time taken by the ADC 418 in startup mode is very less as the known pattern is used to determine all the associated errors. Hence, a power up time of the ADC 418 is significantly reduced.

Modifications are possible in the described embodiments, and other embodiments are possible, within the scope of the claims.

What is claimed is:

1. An analog to digital converter (ADC) comprising:
   a flash ADC configured to generate a flash output in response to an input signal;
   an error correction block configured to generate a known pattern; and
   a residual ADC configured to generate a residual code in response to the input signal, the known pattern and an analog PRBS (pseudo random binary sequence) signal.

2. The ADC of claim 1 further comprising:
   a selector block coupled to the flash ADC and the error correction block, and configured to generate a plurality of selected signals in response to the flash output and the known pattern;

a digital to analog converter (DAC) coupled to the selector block, and configured to generate a coarse analog signal in response to the plurality of selected signals; and a residue amplifier coupled to the DAC, and configured to generate a residual analog signal in response to the coarse analog signal, the input signal and the analog PRBS signal, wherein the residual ADC is coupled to the residue amplifier.

3. The ADC of claim 1 further comprising:
a secondary multiplexer coupled to the error correction block and configured to generate a digital PRBS signal in response to the known pattern, a coarse PRBS signal and a secondary control signal, wherein the error correction block is configured to provide the coarse PRBS signal and the secondary control signal to the secondary multiplexer; and
a secondary DAC element coupled to the secondary multiplexer, and configured to generate the analog PRBS signal in response to the digital PRBS signal.

4. The ADC of claim 1, wherein the residual code is averaged over T cycles to measure an averaged code generated by the ADC, where T is an integer.

5. The ADC of claim 2, wherein:
the selector block is configured to receive a plurality of control signals from the error correction block; and
the error correction block is configured to receive the flash output and the residual code.

6. The ADC of claim 2, wherein:
the selector comprises a plurality of primary multiplexers, and each primary multiplexer is configured to generate a selected signal of the plurality of selected signals in response to the known pattern, the flash output and a control signal of the plurality of control signals; and
the DAC comprises a plurality of primary DAC elements, and each of the primary DAC element is configured to receive the selected signal.

7. The ADC of claim 1, wherein the ADC is configured to operate in a startup mode and a steady-state mode, wherein in the startup mode the error correction block is configured to measure a coarse gain error, a fine gain error, a PRBS error, a memory error and a DAC mismatch error, and the error correction block is configured to generate a corrected PRBS design value based on the coarse gain error, the fine gain error, the PRBS error, the memory error and the DAC mismatch error, and wherein the error correction block is configured to use the corrected PRBS design value in the steady-state mode to measure the input signal.

8. The ADC of claim 7, wherein the error correction block is configured to provide the known pattern to a primary DAC element of the plurality of primary DAC elements, and the flash ADC is configured to provide a predefined set of bits to the remaining primary DAC elements.

9. The ADC of claim 8, wherein the error correction block is configured to measure the coarse gain error from the averaged code generated by the ADC, a step size of the DAC and a reference averaged code.

10. The ADC of claim 7, wherein the error correction block is configured to provide the known pattern to each primary DAC element over M loops, where M is an integer and M is equal to a number of primary DAC elements, and in each loop of M loops:
the error correction block configured to provide the known pattern to a primary DAC element of the plurality of primary DAC elements;
the flash ADC configured to provide the predefined set of bits to the remaining primary DAC elements; and
the error correction block configured to measure the averaged code generated by the ADC.

11. The ADC of claim 10, wherein the error correction block is configured to measure the fine gain error from the averaged code generated by the ADC in each loop of the M loops, the step size of the DAC and the reference averaged code.

12. The ADC of claim 11, wherein the error correction block is configured to measure a mismatch of a first primary DAC element of the plurality of primary DAC elements from the coarse gain error, the fine gain error, the step size of the DAC and the averaged code generated by the ADC in a first loop of M loops, wherein the known pattern is provided to the first DAC element in the first loop.

13. The ADC of claim 7, wherein the error correction block is configured to provide the known pattern to the secondary multiplexer, and the digital PRBS signal is equal to known pattern, and the error correction block is configured to measure the averaged code generated by the ADC.

14. The ADC of claim 13, wherein the error correction block is configured to measure the PRBS error from the averaged code generated by the ADC, the fine gain error, the coarse gain error, the reference averaged code and a magnitude of the coarse PRBS signal.

15. The ADC of claim 7, wherein the error correction block is configured to provide the known pattern to a primary DAC element of the plurality of primary DAC elements, and the flash ADC is configured to provide the predefined set of bits to the remaining primary DAC elements, and the error correction block is configured to measure a sub-averaged code generated by the ADC, the sub-averaged code is average of the residual code generated when consecutive bits in the known pattern undergo a state transition over T cycles.

16. The ADC of claim 15, wherein the error correction block is configured to measure the memory error from the sub-averaged code generated by the ADC, the step size of the DAC, the coarse gain error, the fine gain error and the reference averaged code.

17. A method of converting an input signal in an analog to digital converter (ADC) comprising:
generating a flash output in response to the input signal;
generating a known pattern by an error correction block;
generating a residual code in response to the input signal, the known pattern and an analog PRBS (pseudo random binary sequence) signal; and
averaging the residual code over T cycles to generate an averaged code, where T is an integer.

18. The method of claim 17 further comprising:
generating a plurality of selected signals in response to the flash output and the known pattern;
generating a coarse analog signal by a digital to analog converter (DAC) in response to the plurality of selected signals;
generating a residual analog signal in response to the coarse analog signal, the input signal and the analog PRBS signal;
multiplexing the known pattern and a coarse PRBS signal to generate a digital PRBS signal; and
generating the analog PRBS signal in response to the digital PRBS signal.

19. The method of claim 17, wherein the DAC comprises a plurality of primary DAC elements, and each of the primary DAC element is configured to receive a selected signal of the plurality of selected signals.

20. The method of claim 17 further comprising operating the ADC in a startup mode and a steady-state mode, wherein the startup mode comprises:
- measuring a coarse gain error, a fine gain error, a PRBS error, a memory error and a DAC mismatch error; and
- generating a corrected PRBS design value based on the coarse gain error, the fine gain error, the PRBS error, the memory error and the DAC mismatch error.

21. The method of claim 20 further comprising:
- providing the known pattern to a primary DAC element of the plurality of primary DAC elements;
- providing a predefined set of bits to the remaining primary DAC elements;
- measuring the averaged code generated by the ADC; and
- measuring the coarse gain error from the averaged code generated by the ADC, a step size of the DAC and a reference averaged code.

22. The method of claim 20 further comprising:
- operating the ADC in M loops, where M is an integer and M is equal to a number of DAC elements;
- providing the known pattern to a primary DAC element of the plurality of primary DAC elements in each loop of M loops;
- providing the predefined set of bits to the remaining primary DAC elements in each loop;
- measuring the averaged code generated by the ADC in each loop; and
- measuring the fine gain error from the averaged code generated by the ADC in each loop of the M loops, the step size of the DAC and the reference averaged code.

23. The method of claim 22 further comprising measuring a mismatch of a first DAC element of the plurality of DAC elements from the coarse gain error, the fine gain error, the step size of the DAC and the averaged code generated by the ADC in a first loop of M loops, wherein the known pattern is provided to the first DAC element in the first loop.

24. The method of claim 20 further comprising:
- providing the known pattern as the digital PRBS signal;
- generating the analog PRBS signal from the digital PRBS signal;
- measuring the averaged code generated by the ADC; and
- measuring the PRBS error from the averaged code generated by the ADC, the fine gain error, the coarse gain error, the reference averaged code and a magnitude of the coarse PRBS signal.

25. The method of claim 20 further comprising:
- providing the known pattern to a primary DAC element of the plurality of primary DAC elements;
- providing the predefined set of bits to the remaining primary DAC elements;
- measuring a sub-averaged code generated by the ADC, the sub-averaged code is average of the residual code generated when consecutive bits in the known pattern undergo a state transition over T cycles; and
- measuring the memory error from the sub-averaged code generated by the ADC, the step size of the DAC, the coarse gain error, the fine gain error and the reference averaged code.

26. A computing device comprising:
- a processing unit;
- a memory module coupled to the processing unit; and
- a plurality of logic units coupled to the processing unit and the memory module, at least one logic unit of the plurality of logic units comprising an ADC, the ADC comprising:
  - a flash ADC configured to generate a flash output in response to an input signal;
  - an error correction block configured to generate a known pattern; and
  - a residual ADC configured to generate a residual code in response to the input signal, the known pattern and an analog PRBS (pseudo random binary sequence) signal.

* * * * *